United States Patent
Dixit et al.

(10) Patent No.: US 7,202,517 B2
(45) Date of Patent: Apr. 10, 2007

(54) MULTIPLE GATE SEMICONDUCTOR DEVICE AND METHOD FOR FORMING SAME

(75) Inventors: Abhisek Dixit, Leuven (BE); Kristin De Meyer, Herent (BE)

(73) Assignee: Interuniversitair Microelektronica Centrum (IMEC vzw), Leuven (BE)

( * ) Notice: Subject to any disclaimer, the term of this patent is extended or adjusted under 35 U.S.C. 154(b) by 251 days.

(21) Appl. No.: 10/893,185

(22) Filed: Jul. 16, 2004

(65) Prior Publication Data

US 2005/0051812 A1 Mar. 10, 2005

Related U.S. Application Data

(60) Provisional application No. 60/488,328, filed on Jul. 18, 2003.

(30) Foreign Application Priority Data

Sep. 25, 2003 (EP) ................... 03447238

(51) Int. Cl.
*H01L 29/78* (2006.01)

(52) U.S. Cl. .............. 257/287; 257/E29.264; 438/289

(58) Field of Classification Search .......... 257/240, 257/241, 287, 327, E29.264, E29.319; 438/283
See application file for complete search history.

(56) References Cited

U.S. PATENT DOCUMENTS

| 6,372,582 | B1 | 4/2002 | Rouse et al. | 438/289 |
|---|---|---|---|---|
| 6,383,876 | B1 | 5/2002 | Son et al. | 438/289 |
| 6,475,869 | B1 | 11/2002 | Yu | 438/303 |
| 6,727,550 | B2 | 4/2004 | Tezuka et al. | 257/347 |
| 2002/0011612 | A1 | 1/2002 | Hieda | 257/262 |
| 2002/0036290 | A1* | 3/2002 | Inaba et al. | 257/66 |
| 2003/0003679 | A1 | 1/2003 | Doyle et al. | 438/406 |
| 2003/0006461 | A1 | 1/2003 | Tezuka et al. | 257/347 |
| 2003/0141569 | A1 | 7/2003 | Fried et al. | 257/536 |
| 2004/0217433 | A1* | 11/2004 | Yeo et al. | 257/412 |
| 2004/0256647 | A1* | 12/2004 | Lee et al. | 257/289 |
| 2004/0262692 | A1* | 12/2004 | Hareland et al. | 257/369 |

FOREIGN PATENT DOCUMENTS

| EP | 0304811 | 3/1989 |
|---|---|---|
| EP | 0623963 | 11/1994 |
| WO | WO 0115220 | 3/2001 |

(Continued)

OTHER PUBLICATIONS

Hisamoto et al., "A Folded-channel MOSFET for Deep-sub-tenth Micron Era", IEDM Technical Digest, pp. 1032-1034 (1998).

(Continued)

*Primary Examiner*—Carl Whitehead, Jr.
*Assistant Examiner*—Jennifer M Dolan
(74) *Attorney, Agent, or Firm*—McDonnell Boehnen Hulbert & Berghoff LLP

(57) ABSTRACT

A multiple gate semiconductor device. The device includes at least two gates. The dopant distribution in the semiconductor body of the device varies from a low value near the surface of the body towards a higher value inside the body of the device.

17 Claims, 13 Drawing Sheets

FOREIGN PATENT DOCUMENTS

WO    WO 2004032246    4/2004

OTHER PUBLICATIONS

Wolf and Tauber, "*Silicon Processing for the VLSI Era*", vol. 1-Process Technology, 2nd Edition, Lattice Press, pp. 225-242, 245-247 (2000).

Kedzierski et al., "*High-performance symmetric-gate and CMOS-compatible V, asymmetric-gate FinFET devices*", IEDM Technical Digest, pp. 437-440 (2001).

"*International Technology Roadmap for Semiconductors 2001 Edition Executive Summary*", Semiconductor Industry Association (2001).

Wong, "*Beyond the conventional transistor*", IBM Journal of Research and Developement, vol. 46 No. 2/3, pp. 146-152, figures 14, 15, 17 (Mar./May 2002).

Chen et al., "*A Comprehensive Analytical Subthreshold Swing (S) Model for Double-Gate MOSFETs*". IEEE Transactions on Electronic Devices, vol. 49 No. 6, p. 1086-1090 (Jun. 2002).

Yu et al., "*FinFET Scaling to 10nm Gate Length*", IEDM Technical Digest, pp. 251-254 (Dec. 8-11, 2002).

Choi et al., "*FinFET Process Refinements for Improved Mobility and Gate Work Function Engineering*", IEDM Technical Digest, pp. 259-262 (Dec. 8-11, 2002).

Badcock, et al., "*Device and circuit performance of SiGe/Si MOSFETs*", Solid State Electronics, 46, pp. 1925-1932 (2002).

European Search Report, Application No. EP 03 44 7238, Feb. 11, 2004.

European Search Report, Application No. EP 03 44 7237, dated May 3, 2004.

* cited by examiner

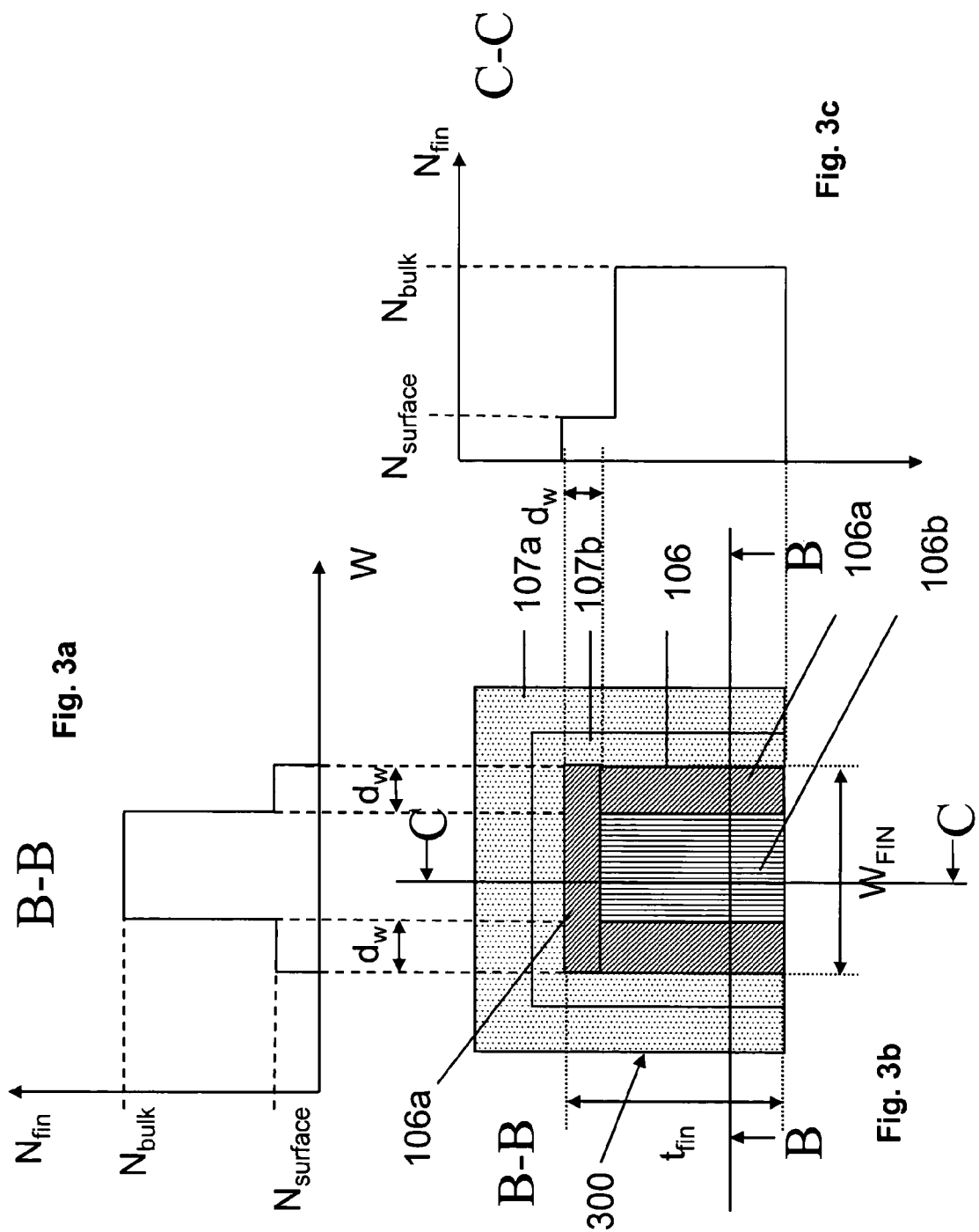

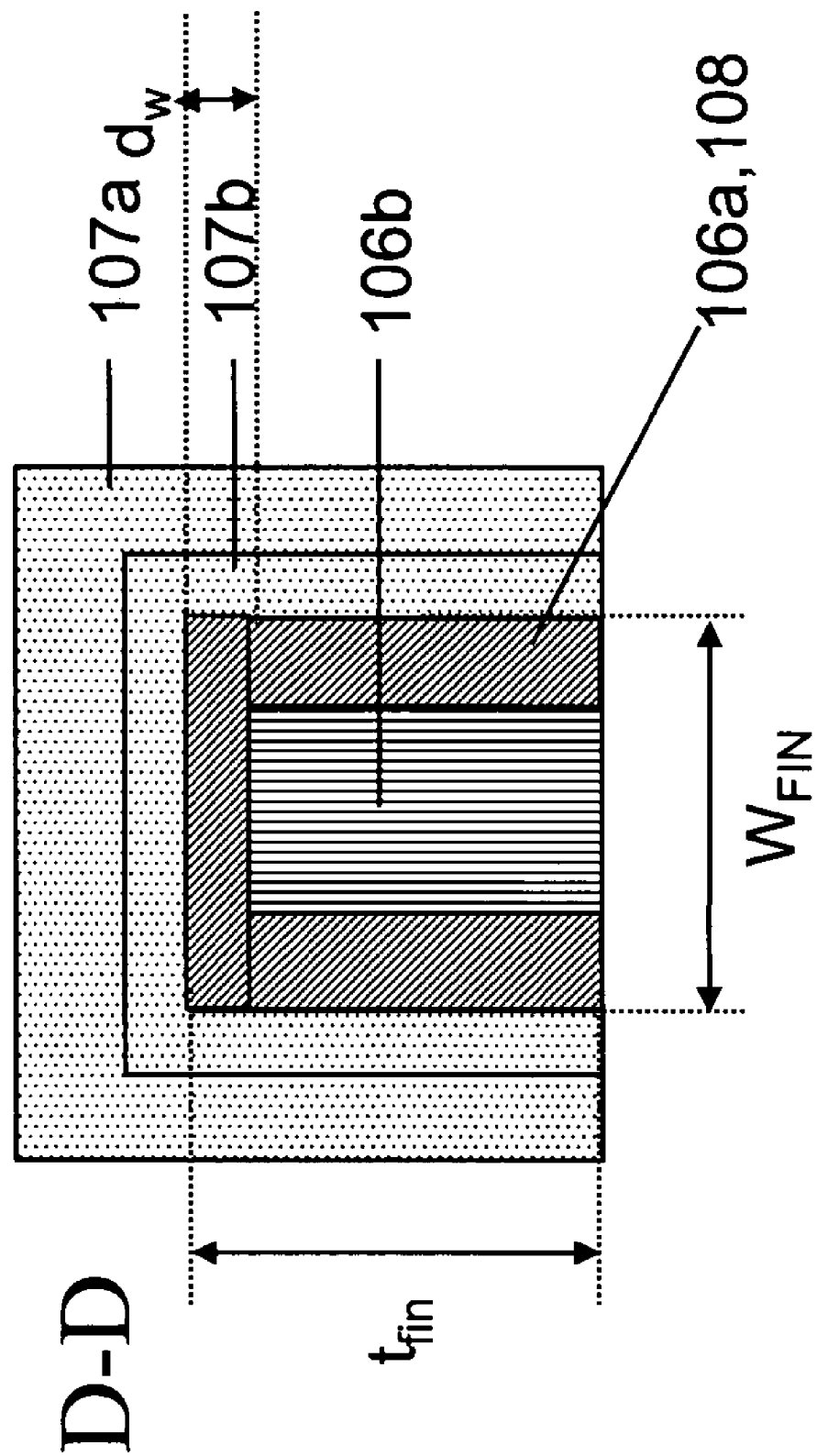

MULTIPLE GATE SEMICONDUCTOR DEVICE AND METHOD FOR FORMING SAME

CROSS REFERENCE TO RELATED APPLICATIONS

This application claims the benefit under 35 U.S.C. § 119(e) of U.S. Provisional Patent Application No. 60/488,328, filed on Jul. 18, 2003 and under 35 U.S.C. § 119(a) of European patent application EP 03447238.1, filed on Sep. 25, 2003. U.S. Provisional Patent Application No. 60/488,328 and European patent application EP 03447238.1 are herein incorporated by reference in their entirety.

BACKGROUND

1. Field of the Invention

This invention is related to integrated circuits and methods for manufacturing such integrated circuits. More particularly, the present invention relates to semiconductor devices with multiple gates and non-uniform doping profiles in the channel region of those devices.

2. Description of Related Art

Current semiconductor chips feature technology with circuit feature sizes in the range of 130 nanometers, with components manufactured with technologies having 90 nanometer feature sizes just beginning to reach the marketplace. Industry plans are to deliver 65 nanometer technologies in the year 2007, 45 nanometer technologies in the year 2010, 32 nanometer technologies in the year 2013 and 22 nanometer technologies in the year 2016. This schedule was set forward in the International Technology Roadmap for Semiconductors (ITRS) defined by the Semiconductor Industry Association (SIA) in 2001. The schedule translates to smaller chip dimensions earlier in time than had been previously thought. Among the main transistor scaling issues to be solved is the need for thinner gate oxides that result in a higher on-current and hence increased switching speed in semiconductor devices; a smaller off-current and lower threshold voltage to allow such gate oxide scaling, and the use of lower supply voltages; a higher channel mobility; and smaller series resistance of the source/drain regions. In order to meet these forecasted stringent scaling requirements, non-classical Complementary Metal-Oxide-Semiconductor (CMOS) devices and alternative materials, such as metal gate materials and high dielectric constant (high-k) gate dielectrics are currently under investigation.

One non-classical CMOS device is so-called Fin Field Effect Transistors (FinFETs). In a FinFET, the gate at least partially envelops the channel region in multiple planes, as compared to a classic planar CMOS device where the gate electrode is formed in a single plane on top of the channel region, where the channel region is part of the substrate.

A double gate FinFET made by using the sidewalls of a dry-etched silicon (Si) fin as conducting channels was discussed by D. Hisamoto et al. in "A folded-channel MOSFET for deep-sub-tenth Micron Era" in the IEDM Technical Digest 1998 pp. 1032–1034. In such FinFETs, a thin gate line straddles a thin silicon channel fin. Bin Yu et al, discusses an alternative process to manufacture a FinFET device in "FinFET scaling to 10 nm Gate Length", IEDM Technical Digest 8–11 Dec., 2002 pp. 251–254. For the process described by Yu et al., polysilicon is used as a gate electrode material and the channel of the device is uniformly lightly doped.

While is possible for a FinFET be manufactured in a near-planar fashion, such that the manufacturing is compatible with traditional CMOS processing technologies, the performance of FinFET devices manufactured in such a fashion is typically inferior to traditional planar CMOS transistors manufactured with the same processing technology. The respective performance of such devices (FinFET versus planar CMOS) may be indicated by various parameters such as the sub-threshold swing (S, mV/dec), which is the variation of drive current with gate voltage for gate voltages below the transistor threshold voltage ($V_t$), the maximum or saturation drive current ($I_{on}$), the off state-current or leakage current ($I_{off}$), the threshold voltage roll-off ($\Delta V_t$) expressing the dependency of the threshold voltage on channel length ($L_g$) and drain voltage ($V_{ds}$).

Two approaches are currently being employed to improve the performance (as measured by such parameters) of FinFET devices manufactured using CMOS technologies. A first approach is to increase the dopant concentration level ($N_{fin}$) of the fin. Although this approach yields a low sub-threshold slope and a controllable threshold voltage, during operation, when inversion occurs near the surface of the fin, the carrier mobility is degraded due to ionized impurity scattering. This results in a lower saturation current, which slows down the device and reduces its performance. Further, in such an approach, threshold voltage roll-off will be more pronounced, as the highly doped fin will typically not become fully depleted during operation.

A second approach involves reducing the fin doping concentration level $N_{fin}$ and developing a tunable work-function gate technology. Such an approach is described by Yang-Kyu Choi et al. in "FinFET Process Refinements for Improved Mobility and Gate Work Function Engineering" in IEDM 2002 Digest International, 8–11 Dec., 2002, pp. 259–262. Apart from forming a high quality interface between the fin and the gate dielectric, the mobility of the carriers may be improved by lowly doping the fin resulting in less ionized impurity scattering and, hence, in a larger saturation current. Further, the lowly doped fin also increases the immunity of the threshold voltage to fluctuations in the dopant distribution profile.

However, because of the low doping of the fin, the threshold voltage is determined by the work function of the gate electrode, which must then be carefully selected in order to obtain the desired threshold voltage for either n-type or p-type FinFETs. This approach is cumbersome, as only a limited selection of materials is available, thereby still requiring additional efforts to tune the work function of these materials to the desired value. The introduction of such materials increases the manufacturing process complexity as additional process steps may be employed.

Still further, the low doping concentration of the fin results in a higher sub-threshold slope and, consequently, in increased leakage current and increased power consumption as is described in "A Comprehensive Model Analytical Sub-threshold Swing (S) Model for Double-gate MOSFETs" by Qiang Chen et al, in IEEE Transactions on Electronic Devices, Vol. 49, No. 6, Jun. 2002, p. 1086. Based on the foregoing, alternative FinFET devices and methods for manufacturing FinFET devices that improve their performance without degrading other device parameters such as sub-threshold slope, saturation current, leakage current and threshold voltage roll-off are desirable.

SUMMARY

Embodiments of the invention address, at least some of, the performance concerns of current FinFET approaches, such as degradation of sub-threshold slope, saturation current, leakage current and threshold voltage roll-off parameters. In one embodiment, a multi-gate semiconductor device includes a source region, a drain region, a semiconductor body in between the source region and the drain region, which connects the source region and the drain region; and a gate electrode on at least two sides of the semiconductor body. The semiconductor body includes a first region having a first dopant level and a second region that is in between the gate electrode and the first region. The second region has a second dopant level that is lower than the first dopant level. Such a device may be referred to as having a retrograde doping profile or a as being a retrograde device.

Such a multi-gate semiconductor retrograde device may take the form of a retrograde FinFET device, where the semiconductor body is the fin of the FinFET device. In certain embodiments, the first dopant level remains constant over the first region and the second dopant level remains constant over the second region. In alternative embodiments, the dopant concentration in the second region decreases from the first dopant level to the second dopant level over at least a portion of the second region.

An embodiment of a method for manufacturing a retrograde doped multi-gate device, such as the FinFET device described above includes providing a substrate, where the substrate has a source, a drain and a fin connecting the source and the drain. In this embodiment, the fin has a first dopant level. The method further includes forming a layer, at least at the exposed surfaces of the fin, where the formed layer has a dopant level lower than the first dopant level. Such devices have improved performance without substantially degrading other device parameters, such as sub-threshold slope, saturation current, leakage current and threshold voltage roll-off.

These and other aspects will become apparent to those of ordinary skill in the art by reading the following detailed description, with reference, where appropriate, to the accompanying drawings. Further, it should be understood that the embodiments noted in this summary are not intended to limit the scope of the invention as claimed.

BRIEF DESCRIPTION OF THE DRAWINGS

The appended drawings are intended to illustrate some aspects and embodiments of the present invention. Devices in the drawings are depicted in a simplified way for reason of clarity. Not all alternatives and options are shown and, therefore, the invention is not limited in scope by the drawings. It is noted that like reference numerals are employed to reference analogous parts of the various drawings, in which:

FIG. 3 includes FIG. 3b, which is a cross-sectional drawing of a triple gate semiconductor device having retrograde doping, FIG. 3a, which illustrates the dopant profile of the device of FIG. 3b in the horizontal direction, and FIG. 3c, which illustrates the dopant profile of the device of FIG. 3b in the vertical direction;

FIG. 6 illustrates an alternative FinFET device according to another embodiment of the invention, where FIG. 6d is a cross-sectional drawing of the FinFET device of FIG. 6c.

DETAILED DESCRIPTION

While embodiments of multiple gate semiconductor devices are generally discussed herein with respect to Fin Field Effect Transistors (FinFETs), it will be appreciated that the invention is not limited in this respect and that embodiments of the invention may be implemented in any number of types of device. For example, in his article "Beyond the Conventional Transistor", published in IBM Journal of Research & Development, Vol. 46, No. 23 2002, which in incorporated by reference herein in it entirety, H. S. Wong discloses various types of multi-gate devices. In FIG. 14, 15 and 17 of this paper, alternative orientations of double and triple gate devices are depicted with the corresponding process sequences being detailed on pages 146–152. Such device configurations may be employed with embodiments of the invention.

1. Current FinFET Device

Figure 1A:
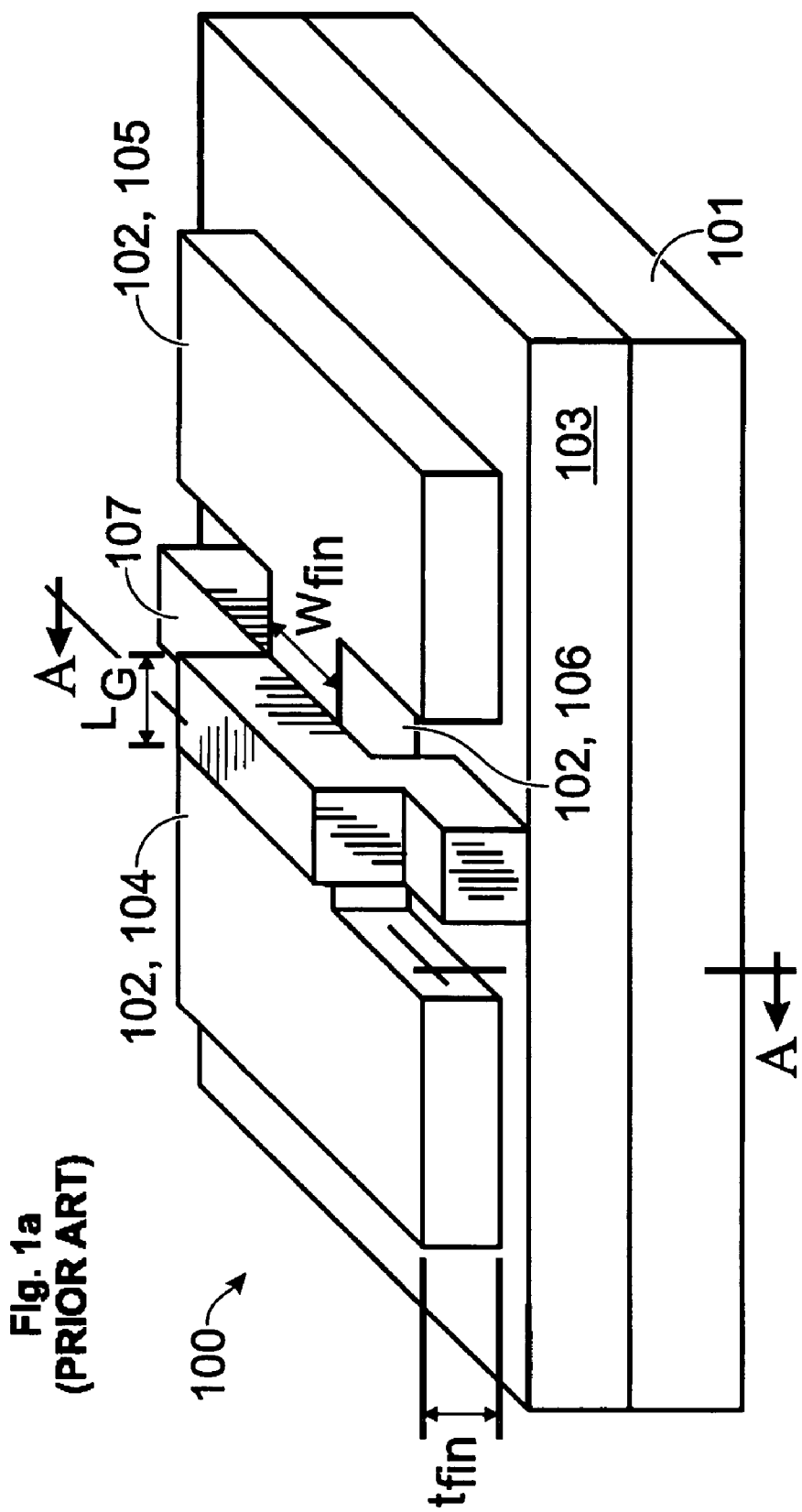
FIG. 1 includes FIG. 1a, which is a drawing of a prior art FinFET device formed in a SOI layer, and FIG. 1b, which is a cross-sectional drawing of the fin of the FinFET device of FIG. 1a along its gate.

FIG. 1a is a drawing of a prior art FinFET device 100. The FinFET device 100 includes a semiconductor layer 102 disposed on a substrate 101. The FinFET device 100 (and other semiconductor devices) are formed on (and in) the substrate 101. The substrate 101 may be a semiconductor substrate, e.g. silicon. An insulating layer 103 is formed on top of the substrate 101 to insulate the semiconductor layer 102 from the substrate 101. This approach results in, for example, a silicon-on-insulator (SOI) substrate or a germanium-on-insulator (GeOI) substrate being formed. The FinFET device 100 includes a source region 104 and a drain 105 region connected by a fin 106, where the fin 106 is located in between the source region 104 and the drain region 105. As may be seen in FIG. 1, the source region 104, the drain region 105 and the fin 106 are formed from the semiconductor layer 102.

The fin 106 constitutes the body of the FinFET 100. Depending on the particular semiconductor manufacturing process flow employed, the source region 104, the drain 105 and the fin 106 may be formed from a single layer of semiconductor material (e.g., the semiconductor layer 102, as shown in FIG. 1a) or from different layers of material. A gate 107, which includes a gate dielectric layer and a gate electrode layer (not separately designated), is also shown in FIG. 1a. The gate 107 overlies the fin 106 on three of its sides (e.g., the top surface and two sidewall surfaces). The channel of the FinFET 100 will be the portion of the fin 106 that is covered by and, depending on the thickness of the gate dielectric, that is under electrical control of the gate voltages applied to the gate 107 (e.g., which may extend beyond the portion of the fin 106 that is physically covered by the gate 107).

Figure 1B:
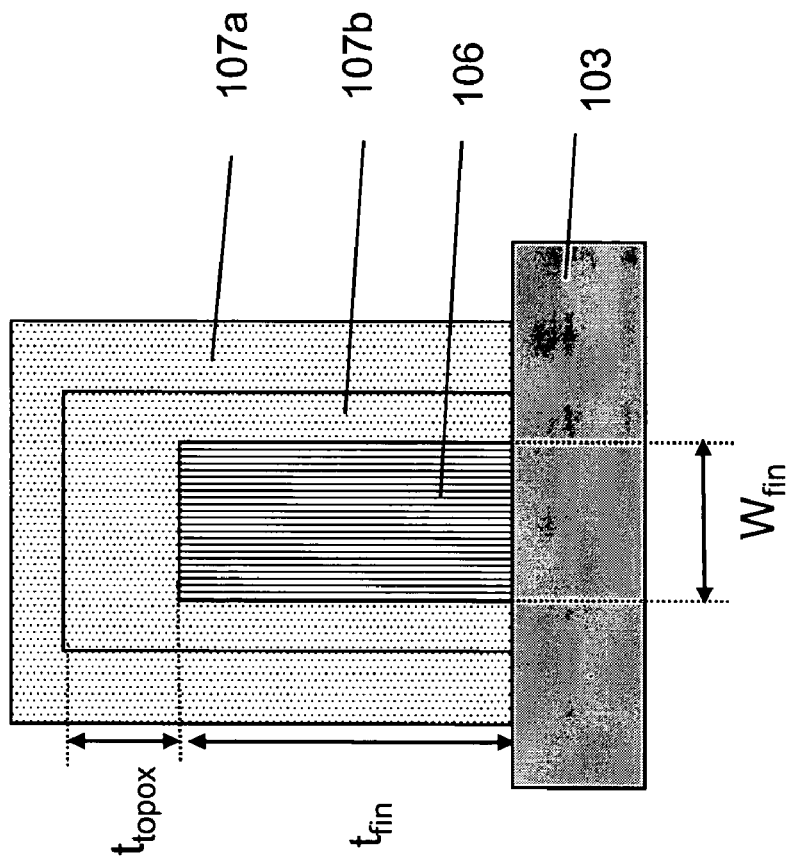

A cross-sectional drawing (along line A-A through the gate 107) of the FinFET 100 is illustrated in FIG. 1b. This drawing shows, in more detail, the overlay of the gate 107 of the fin 106. The gate 107 overlies the fin 106 at both sidewalls of the fin 106 as well on the top of the fin 106. As was indicated above, and is shown in FIG. 1b, the gate 107 includes a gate dielectric 107b and a gate electrode layer 107a. In embodiments where a relatively thick gate dielectric 107b (designated with the thickness $t_{topox}$) is present on top of the fin 106, a double gate device is obtained in which inversion occurs along the upstanding sidewalls of the fin 106 (as shown in FIG. 1b) at a lower threshold voltage than the top of the fin 106. In comparison, for a thin top gate dielectric 107a (e.g., of approximately the same thickness as on the sidewalls), inversion of the top channel would occur in the top surface of the fin 106 at substantially the same threshold voltage as along the sidewalls of the fin 106. Techniques for forming such FinFET devices are discussed in "High-Performance Symmetric-Gate and CMOS Compatible $V_t$ Asymmetric-Gate FinFET devices", IEDM Technical Digest 2001 pp 437–440, by J. Kedzierski et al. For the devices described by Kedzierski et al., the source and drain regions are formed together with the fin in an SOI layer using optical lithography, hard mask trimming techniques and uniform doping of the channel region in the fin 106. However, adjusting the threshold voltage of such devices to improve their performance results in other device parameters, such as saturation current, leakage current, sub-threshold slope, threshold voltage roll-off, being degraded, thus adversely impacting device performance.

2. Improved FinFET Device

To improve the performance of multiple gate semiconductor devices, such as the FinFET 100 illustrated in FIG. 1, it would be advantageous to be able to adjust the threshold voltage of the device without significantly degrading other device parameters, such as saturation current, leakage current, sub-threshold slope, threshold voltage roll-off.

FIG. 2 illustrates a FinFET device 200 that allows for adjustment of its threshold voltage without significantly degrading other performance related parameters of the device. The FinFET 200 includes a retrograde doped channel. In this context, retrograde doping means that the doping of the fin (which includes the channel) is relatively low at the surface of the fin, but increases towards the bulk of the fin. For such a doping profile, high surface mobility of the carriers is obtained because ionized impurity scattering is reduced. Further, the higher bulk doping concentration allows for tuning the threshold voltage of the FinFET device 200 without significantly degrading the other device parameters. For such devices, polysilicon may be used for the gate electrode 107a, as is typically used for gate electrodes of classical MOS devices. Alternatively, other gate materials, such as metals, may be used. In the latter case, the higher bulk doping offers an additional degree of freedom for obtaining the desired threshold voltage relative to tuning the work function of the gate electrode material.

Figure 2A:
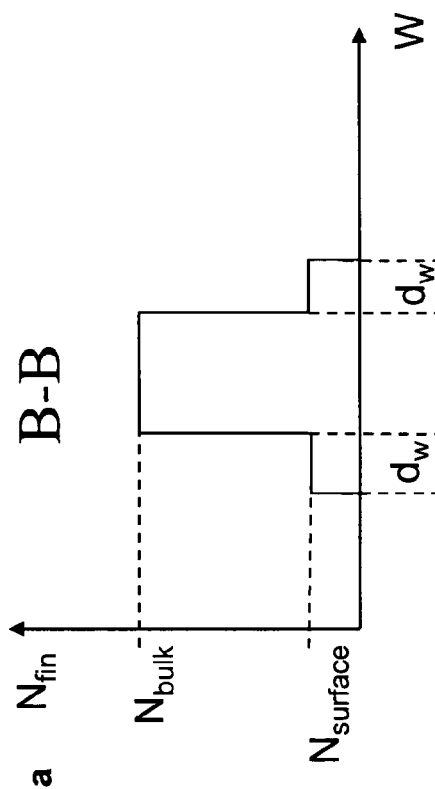
FIG. 2 includes FIG. 2b, which is a cross-sectional drawing of a dual gate semiconductor device having a lowly doped region and a highly doped region (e.g., a retrograde doping profile), and FIG. 2a, which illustrates the dopant profile of the device of FIG. 2b.
Figure 2B:
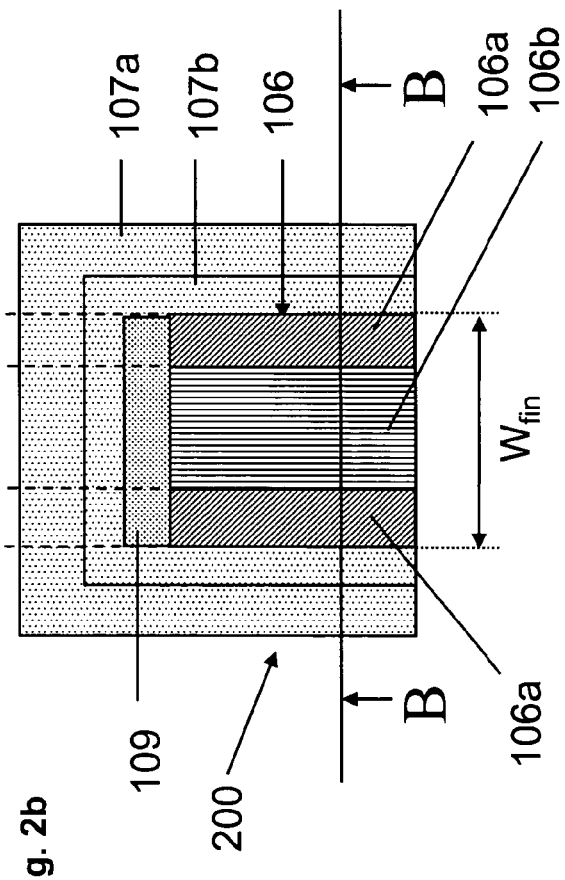

Referring to FIG. 2a, a retrograde doping profile for the FinFET device 200 shown in FIG. 2b (which is a cross section view along a similar line as line A—A of FIG. 1) is shown. As may be seen in FIG. 2a, the surface dopant level of the fin 106 has a constant value $N_{surface}$ over a depth $d_w$ (e.g., the surface regions 106a of the fin 106) into the fin 106 and a higher constant value $N_{bulk}$ in the bulk 106b of the fin 106 over a distance $W_{fin}-2d_w$.

For the FinFET 200, a blocking layer 109 is formed on the top surface of the fin 106. The layer 109 is used to prevent formation of the lowly doped region 106a at the top of fin 106 and also to implement the FinFET 200 as a multiple (two) gate device by effectively increasing the gate dielectric thickness (in conjunction with gate dielectric 107b on the top surface of the fin 106. Alternatively, the thickness of gate dielectric 107b on top of the fin 106 may be relatively thick as compared to its thickness on the sidewalls of the fin 106 (in similar fashion as shown in FIG. 2b). For such two gate devices, it is sufficient to employ a retrograde dopant profile in the fin in only the horizontal direction, as is shown in FIG. 2b.

In such an approach, lowly doped regions 106a are formed at or near the interface between the fin 106 and the gate dielectric 107b along each of the sidewalls of the fin 106. For the device illustrated in FIG. 2, the dopant concentration at a given point in the fin 106 remains constant in the vertical direction (e.g., perpendicular to the substrate 101). However, it will be appreciated that variation in the doping concentration will be present at the boundaries of the bulk region 106b and the other regions 106a.

Referring now to FIG. 3, a triple gate FinFET 300 is illustrated. FIG. 3b is a drawing illustrating a cross-section of such the FinFET device 300. As may be seen in FIG. 3b, the FinFET 300 is formed by having thin gate dielectric 107b (e.g., of substantially the same thickness as on the sidewalls of the fin 106) on top of the fin 106. For the FinFET 300 a lowly doped region 106a is also formed along the top surface of the fin 106 in addition to the lowly doped regions 106 a formed along the sidewalls of the fin 106).

FIG. 3a illustrates the dopant profile in the horizontal direction along the line B—B of FIG. 3b. This profile is similar to the dopant profile shown in FIG. 2a. In the FinFET 300, during operation, conduction will occur not only along the sidewalls of the fin 106, but also along the top surface of the fin 106 in a direction parallel with the substrate 101. Along line B—B, the lowly doped region 106a has a low doping concentration $N_{surface}$ over a distance $d_w$ at each sidewall of the fin 106, while the bulk region 106b has a higher constant doping concentration value $N_{bulk}$ over a distance $W_{fin}-2d_w$.

FIG. 3c illustrates the dopant profile of the fin 106 along the line C—C of FIG. 3b. As may be seen from the dopant profile, a lowly doped region 106a is present along a depth $d_w$ from the interface between the top surface of the fin 106 and the gate dielectric 107b towards the bulk 106b of the fin 106. Along line C—C, the lowly doped region 106a has a low doping concentration $N_{surface}$ over a distance $d_w$ at the top surface of the fin 106, while the bulk region 106b has a higher constant doping concentration value $N_{bulk}$ over a distance $t_{fin}-d_w$.

3. Performance Comparisons

FIG. 4 illustrates and compares various aspects of three different FinFET devices, which demonstrates at least some of the advantages of implementing a retrograde dopant profile over prior art approaches.

Figure 4A:
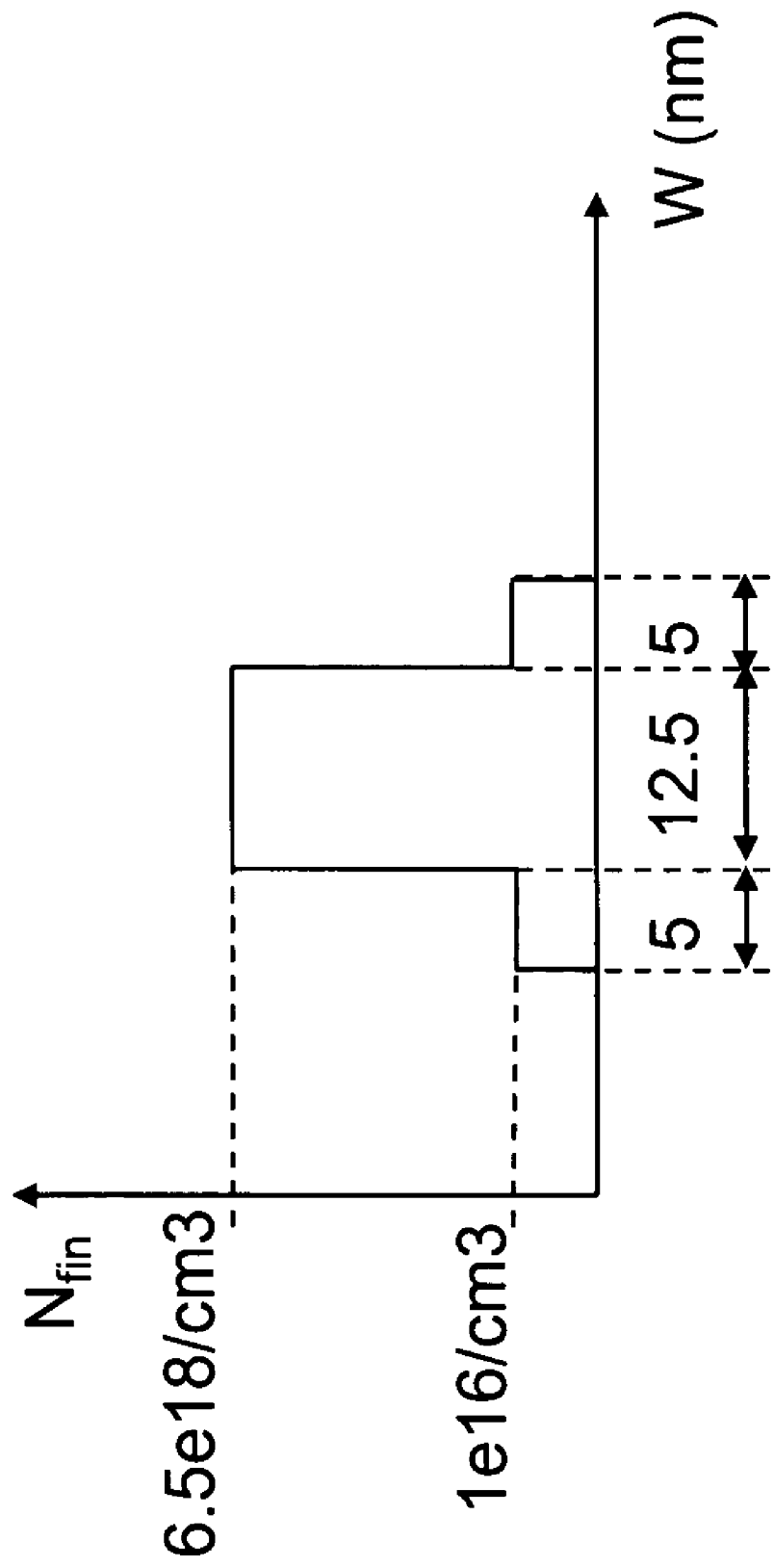
FIG. 4 illustrates various aspects of three alternative FinFET devices, the three devices having (i) uniform doping of the fin, (ii) retrograde doping in accordance with an embodiment of the invention (e.g., according to the dopant profile shown in FIG. 4a), and (iii) work function engineering of the gate electrode material, where
FIG. 4b illustrates saturation current for the three devices using a linear scale.
FIG. 4c illustrates saturation current for the three devices using a logarithmic scale.
FIG. 4d illustrates sub-threshold swing for the three devices.

FIG. 4a illustrates a dopant profile (such as along the line B—B in FIG. 2b) for the fin or a FinFET device used in this comparison. The width of the fin $W_{fin}$ was approximately 22.5 nm, where the depth $d_w$ of the low doping region on each sidewall of the fin was approximately 5 nm. The doping concentrations for this particular retrograde FinFET were about $N_{surface}$=1e16/cm$^3$ (e.g. in the lowly doped regions 106a, as in FIG. 2b) and about $N_{bulk}$=6.5e18/cm$^3$ (e.g. in the highly doped region 106b, as in FIG. 2b).

Figure 4B:
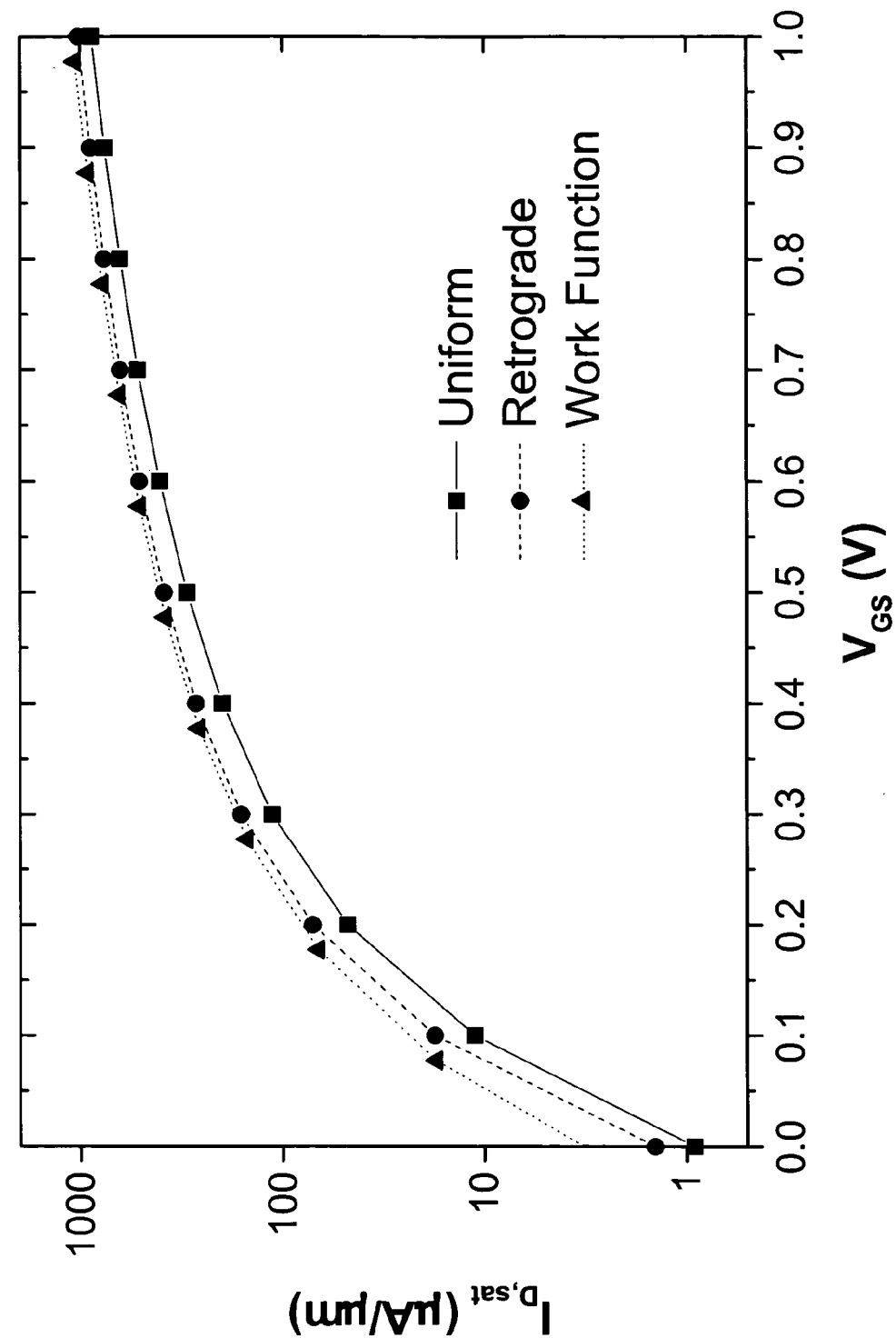
Figure 4C:
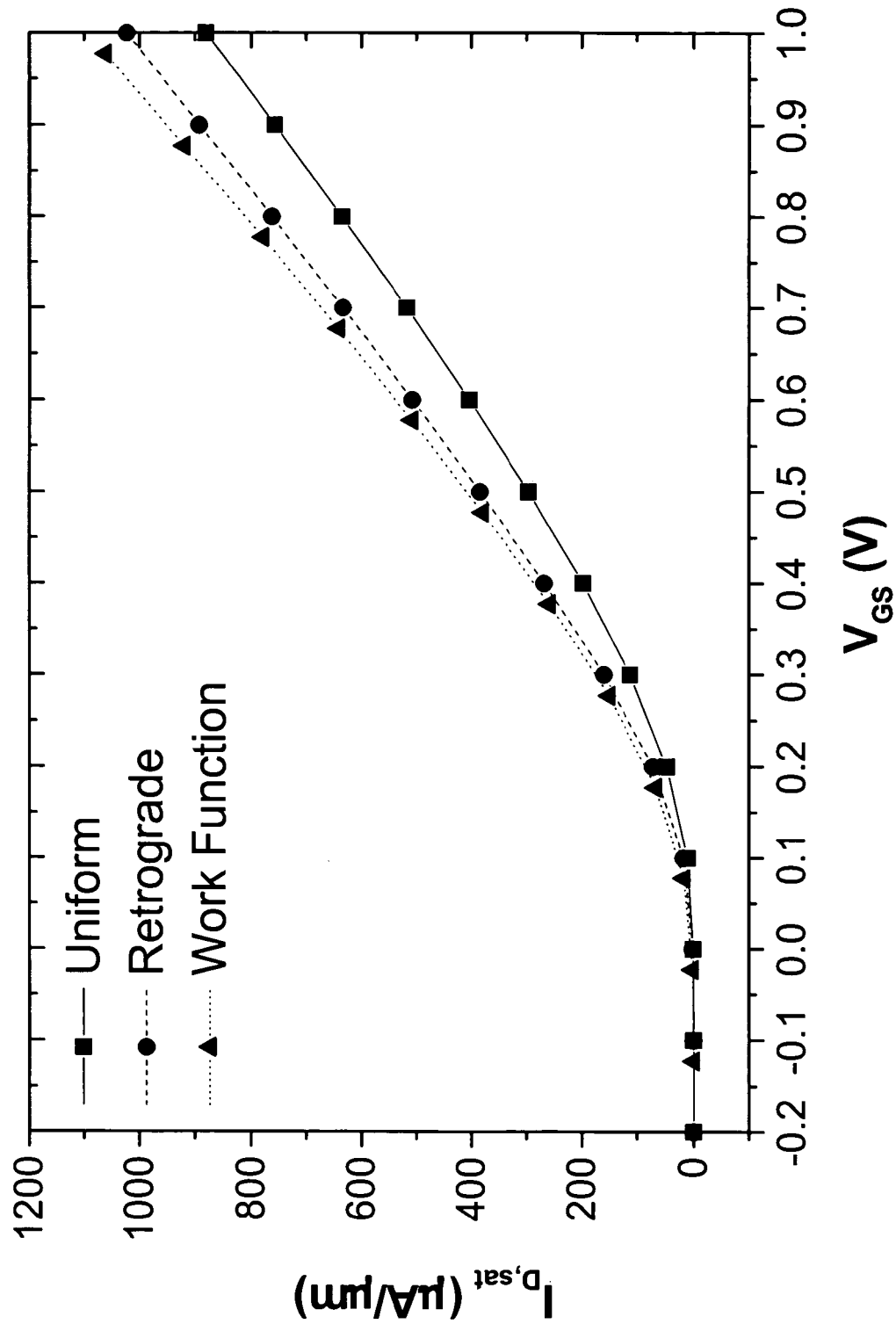
Figure 4D:
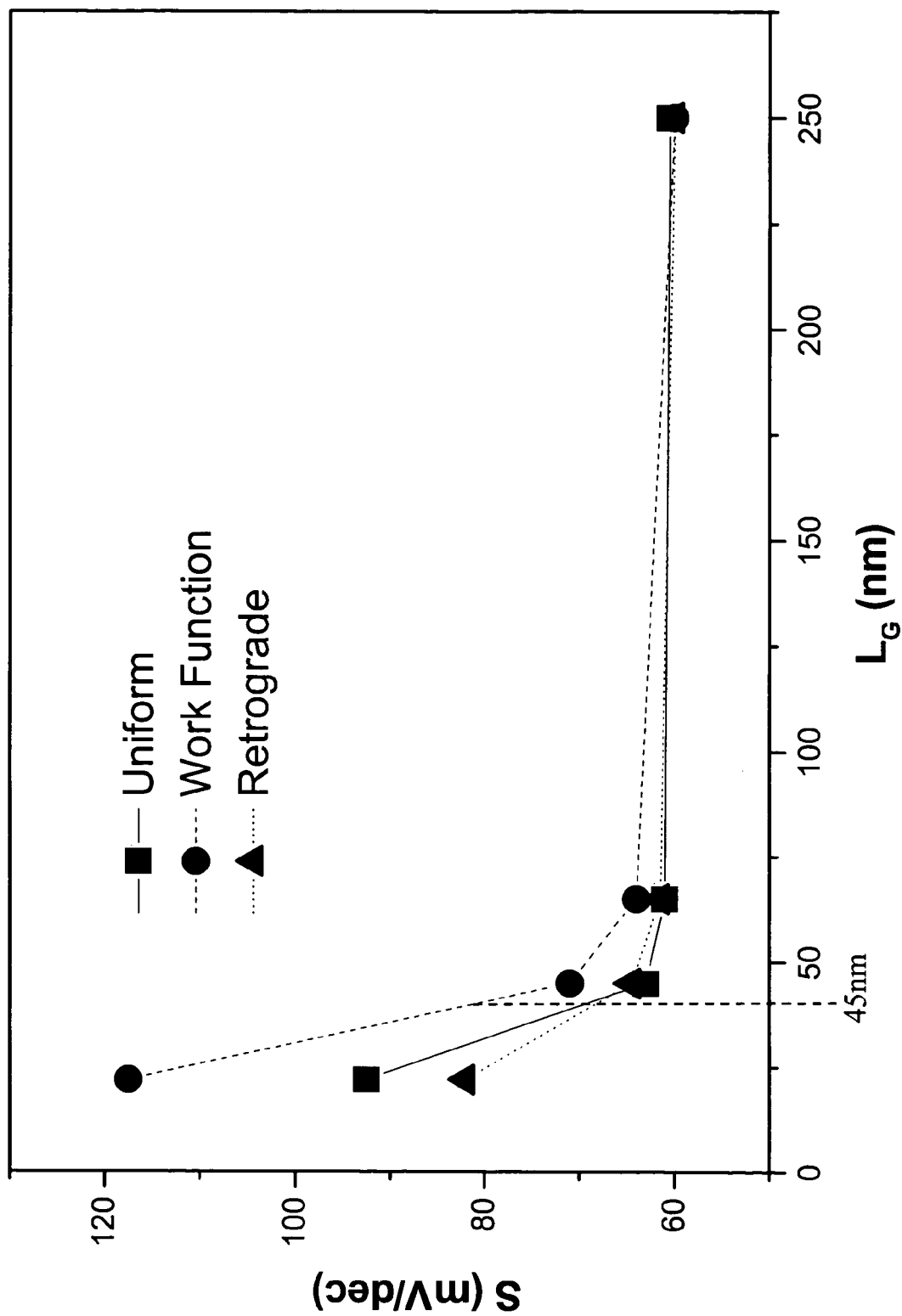

In FIGS. 4b–4d, a FinFET device with the retrograde doping profile shown in FIG. 4a is compared with (i) a FinFET having a threshold voltage of 100 mV manufactured using a uniform doping profile of 3e18 cm$^{-3}$ throughout the fin and (ii) a FinFET manufactured using work function engineering. Work function engineering includes, among other things, selecting an appropriate gate material in order to achieve improved performance of the device. Work function engineering is discussed in the earlier referenced article by H. S. Wong on p. 137.

FIG. 4b illustrates, on a logarithmic scale, a comparison of the saturation current for each the three FinFET devices described above as a function of the gate voltage. At zero gate voltage, the leakage current in the saturation region for each alternative is shown. As may be seen in FIG. 4b, the "work function" device has the largest leakage current, while the "retrograde profile" device performs in comparable fashion with the "uniform profile" device.

FIG. 4c depicts a comparison of the saturation current for each of the three devices being compared as function of the gate voltage. At maximum gate voltage, the drive current for each alternative is shown. As may be seen in FIG. 4c, the "uniform profile" device has the lowest drive current, while the "retrograde profile" performs in comparable fashion with the "work function" device.

FIG. 4d shows a comparison of the sub-threshold swing for each of the three devices as a function of the gate length $L_g$. For a gate length of 45 nm, which is the gate length of the devices compared in FIGS. 4b and 4c, where the devices have threshold voltages of 100 mV, the sub-threshold swing of the "retrograde profile" device is comparable with the sub-threshold swing of the "uniform profile." However, as the gate length is decreased, the sub-threshold swing of the "retrograde profile" device becomes the smallest of all three approaches, indicating that such devices will maintain their performance even with further reduction of processing technology dimensions (e.g., to less than 45 nm).

4. Alternative FinFET Doping Profiles

While the doping profiles of the FinFETs illustrated in FIGS. 2, 3 and 4a are box-like in shape, other doping profiles are possible. For example, referring to FIG. 2b, a doping profile with the bulk portion 106b of the fin 106 having a first constant doping level, and an outer region 106a of the fin 106 where the doping level decreases to a second doping level, being less than the first doping level may be implemented. Within this outer region 106a, the doping level may decrease in various ways: (e.g., linearly, exponentially, etc). In such embodiments, the doping level would change from one value (e.g., the first doping level) to the other value (e.g., the second doping level) over a portion (or over the complete width $d_w$) of the outer region 106a.

Figure 5:
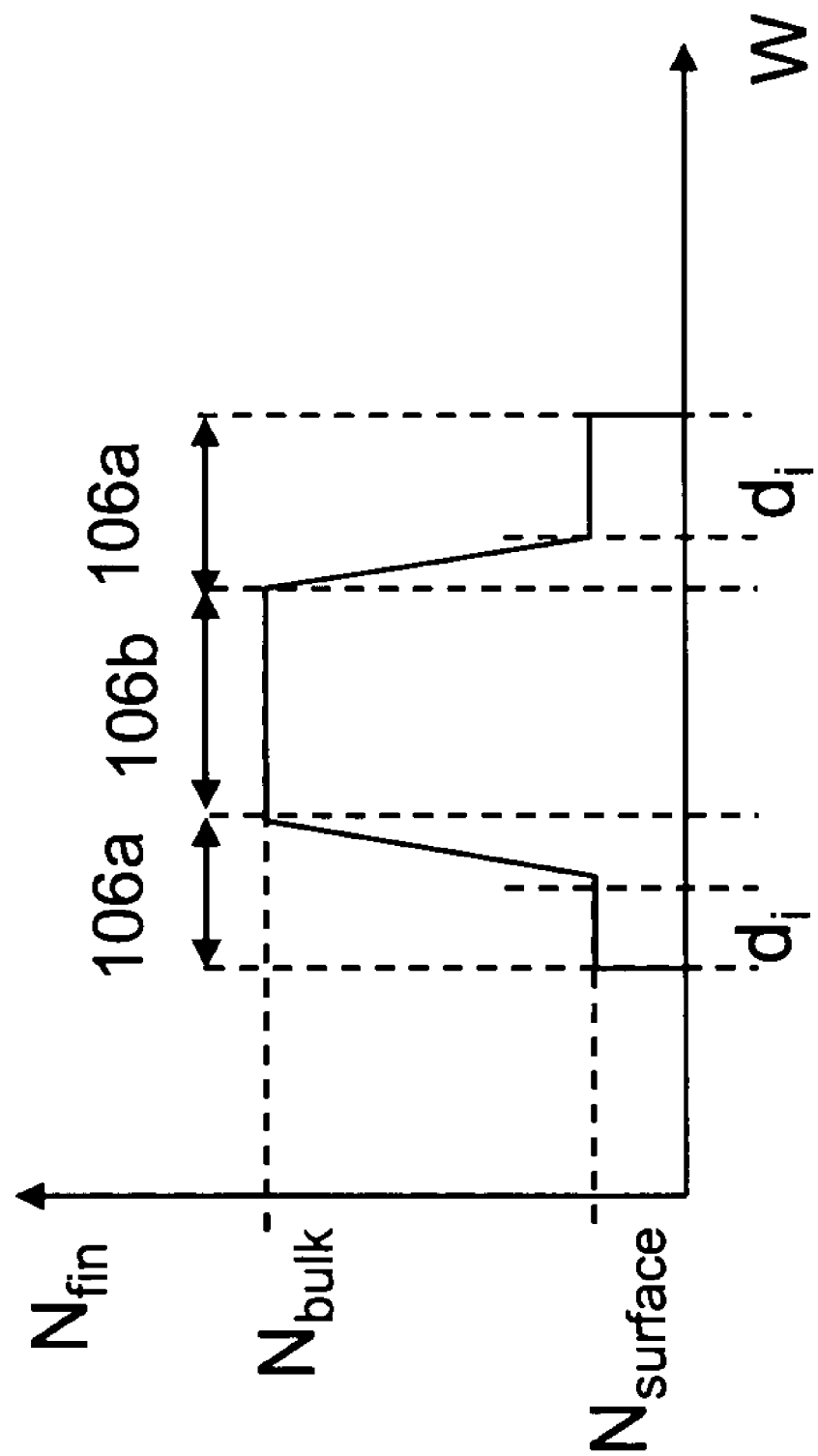
FIG. 5 illustrates a doping profile of the fin of a retrograde FinFET.

Referring to FIG. 5, such an alternative doping profile is shown. As may be seen in FIG. 5, the doping concentration in the fin decreases (when moving from the bulk region 106b to either of the outer regions 106a) from the first doping level $N_{bulk}$ starting at the border of the bulk region 106b and the outer regions 106a to the second doping level $N_{surface}$ within the outer regions 106a. Once the second doping level $N_{surface}$ is reached in the outer regions 106a, the doping level in the outer regions 106a remains constant until the edge of the fin is reached. Because, during operation of such a FinFET, charge carriers will mainly flow in the constantly doped portions of the outer regions 106a, the carriers will be less prone to interference from impurity scattering and, thus, a larger drive current will be obtained as compared to a more heavily doped outer region 106a.

In certain embodiments, the width $d_i$ of the constant doping concentration region within the outer regions 106a corresponds to the width of the inversion layer region. The first doping level may be in the range of 1e18/cm$^3$ to 1e20/cm$^3$, such as 1e19/cm$^3$. The second doping level may be in the range of 1e15/cm$^3$ to 1e17/cm$^3$, such as 1e16/cm$^3$. The values of the first and second doping level will depend, at least in part, on the desired threshold voltage. In one particular embodiment, the first doping level is on the order of 1e19/cm$^3$ and the second doping level is on the order of 1e16/cm$^3$. The fin for this embodiment has a total thickness of about $W_{fin}$=45 nm, with a central (bulk) portion 106b width of about 25 nm and outer regions 106a of about $d_w$=10 nm width per side. Typically, for such devices, the inversion layer thickness is less than a few nanometers.

5. Method of Manufacturing a Retrograde FinFET

Referring now to FIG. 6, drawings illustrating a method of manufacturing a semiconductor device with a retrograde doping profile, such as the devices described above, is illustrated. The method includes employing deposition techniques to form a layer that envelops the body of the device, thus resulting in a bi-layer structure. Each layer of the bi-layer structure (the body and the enveloping layer) has a different doping concentration. The enveloping layer (from which the gate(s) will be formed) is at least present at the surfaces of the body where conduction is to take place. Various techniques exist in semiconductor technology to deposit such layers. For example, one such technique is chemical vapor deposition (CVD), which includes a wide range of deposition processes such as epitaxial layer growth, atomic layer CVD and plasma enhanced CVD.

Referring again to the FinFET 300 illustrated in FIG. 3b, such a method will be generally described. For the FinFET 300, prior to depositing the gate dielectric 107b, a layer, such as a conformal layer, is formed that overlies the fin 106 of the device. This layer can be in-situ doped, (e.g., dopants may be added to the precursors of the gas mixture from which the conformal layer is to be formed). Of course, alternative doping methods may be employed. The dopants are incorporated into the deposited (e.g., conformal) layer. Thus, the dopant concentration of this deposited layer may be different from the dopant concentration in the initial body or the dopant concentration of the patterned fin of the device. The gate dielectric 107b is then formed on top of this deposited layer. The deposited (e.g., conformal layer) may be formed uniformly over an entire wafer or, alternatively, may be formed in a selective manner, such as only on the exposed surfaces of the fin 106. Such a technique may be employed in embodiments where the top surface of the fin 106 is first covered with a layer or treated so as to not react with the species of the deposition atmosphere. This selective deposition may be achieved by using epitaxial layer growth or selective atomic layer deposition (ALD).

For example, Wolf and Tauber teach in "Silicon Processing for the VLSI era, Volume I—Process Technology", 2$^{nd}$ Edition, Lattice Press, epitaxial growth (page 225–226), in-situ doping of layers (section 7.4.3 on page 236) and selective epitaxial growth (section 7.7 on pages 245-247). By way of further example, published PCT Application WO 01/15220 teaches the use of atomic layer deposition (ALD) for forming layers on selected surfaces only. The referenced sections of Wolf and Tauber and PCT Application WO 01/15220 are incorporated by reference herein in their entirety. Generally, such deposition selectivity may be achieved by using layers with different surface chemistry to form selected surfaces, or by pre-treating selected surfaces to block the depositing of a layer on these pre-treated surfaces.

Figure 6A:
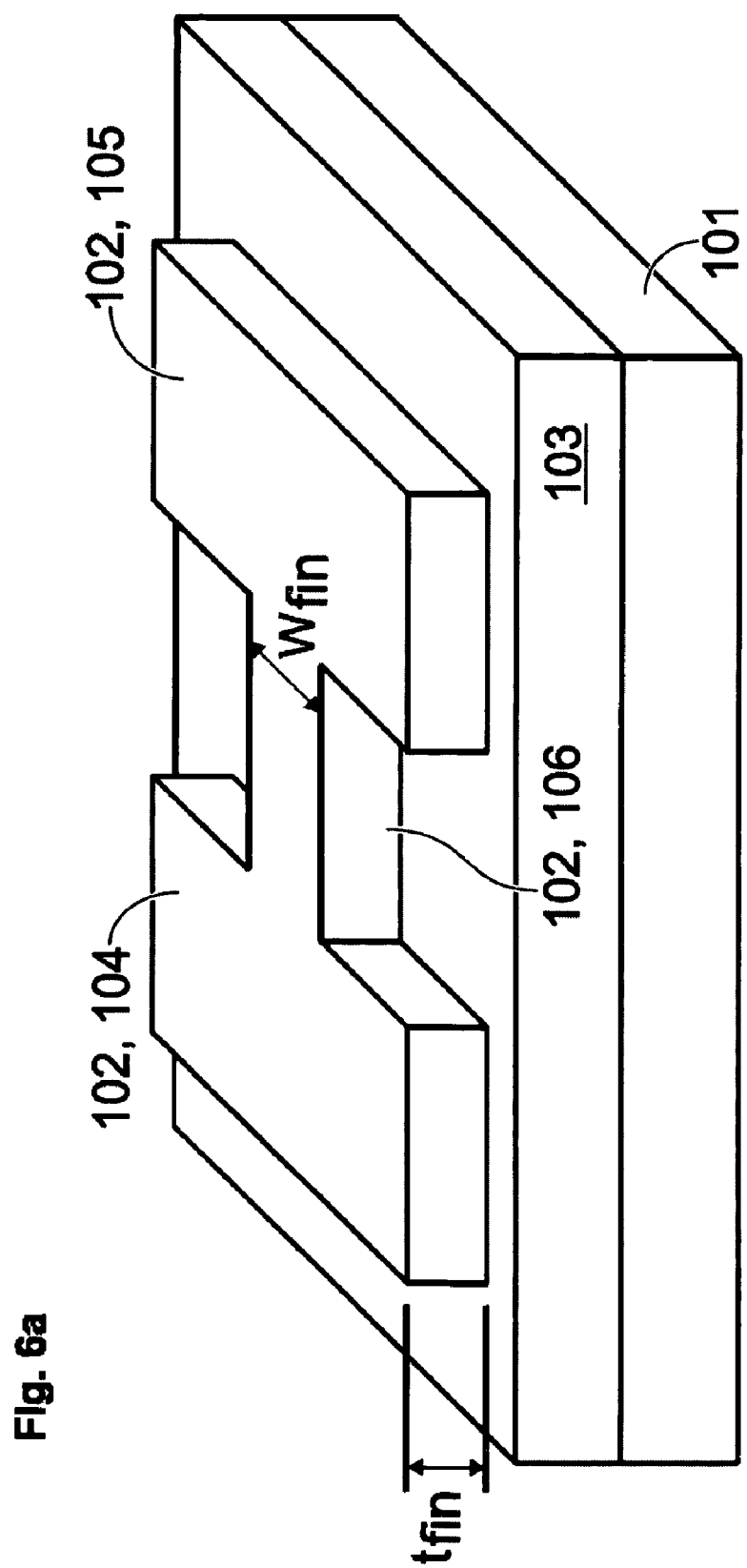
FIG. 6a illustrates a patterned fin with a highly doped body.

Referring now to FIG. 6a, a drawing illustrating a patterned semiconductor layer 102 at an intermediate point of a FinFET manufacturing process is shown. The layer 102 is disposed on an insulating layer 103, which is, in turn, disposed on a substrate 101, as has been previously described. The patterned layer 102 includes a fin 106 having a width $W_{fin}$. The patterned layer 102 further includes a source region 104 and a drain region 105. Alternatively, the source region 104, the drain region 105 and the fin 106 may be formed from separate materials, as opposed to the single semiconductor layer 102 shown in FIG. 6a.

After the layer 102 is patterned, the fin 106 is implanted to a first doping level $N_{bulk}$ which is selected for the bulk of the body based on desired device performance. Alternatively, the $N_{bulk}$ implantation may be done prior to patterning the layer 102 to form the source region 104, the drain region 105 and the fin 106. This implantation may be done using an implantation mask (e.g., only doping the fin 106) or, alternatively, without the use of an implantation mask (e.g., also doping the source region 104 and the drain region 105, or the entire layer 102 before the source region 104, the drain region 105 and the fin 106 are formed). In the latter case, the doping of the source region 104 and the drain region 105 when doping the fin 106 will be compensated for by a higher dose junction doping (using an opposite dopant type) of the source region 104 and the drain region 105 in a subsequent operation. For FinFET devices that employ electrons as carriers (e.g., n-channel devices), the fin 106 will be p-type doped using dopants such as B or BF2, while the source region 104 and the drain region 105 will be n-type doped using dopants such as P or As.

In certain embodiments, a sacrificial oxide may be grown after the patterning of the layer 102 to form the source region 104, the drain region 105 and the fin 106 are formed. The sacrificial oxide is then removed using a wet etch. This growth and etching of the sacrificial oxide will remove damage to the layer 102 resulting from the patterning step, which occurs at the exposed surfaces of before the source region 104, the drain region 105 and the fin 106.

Figure 6B:
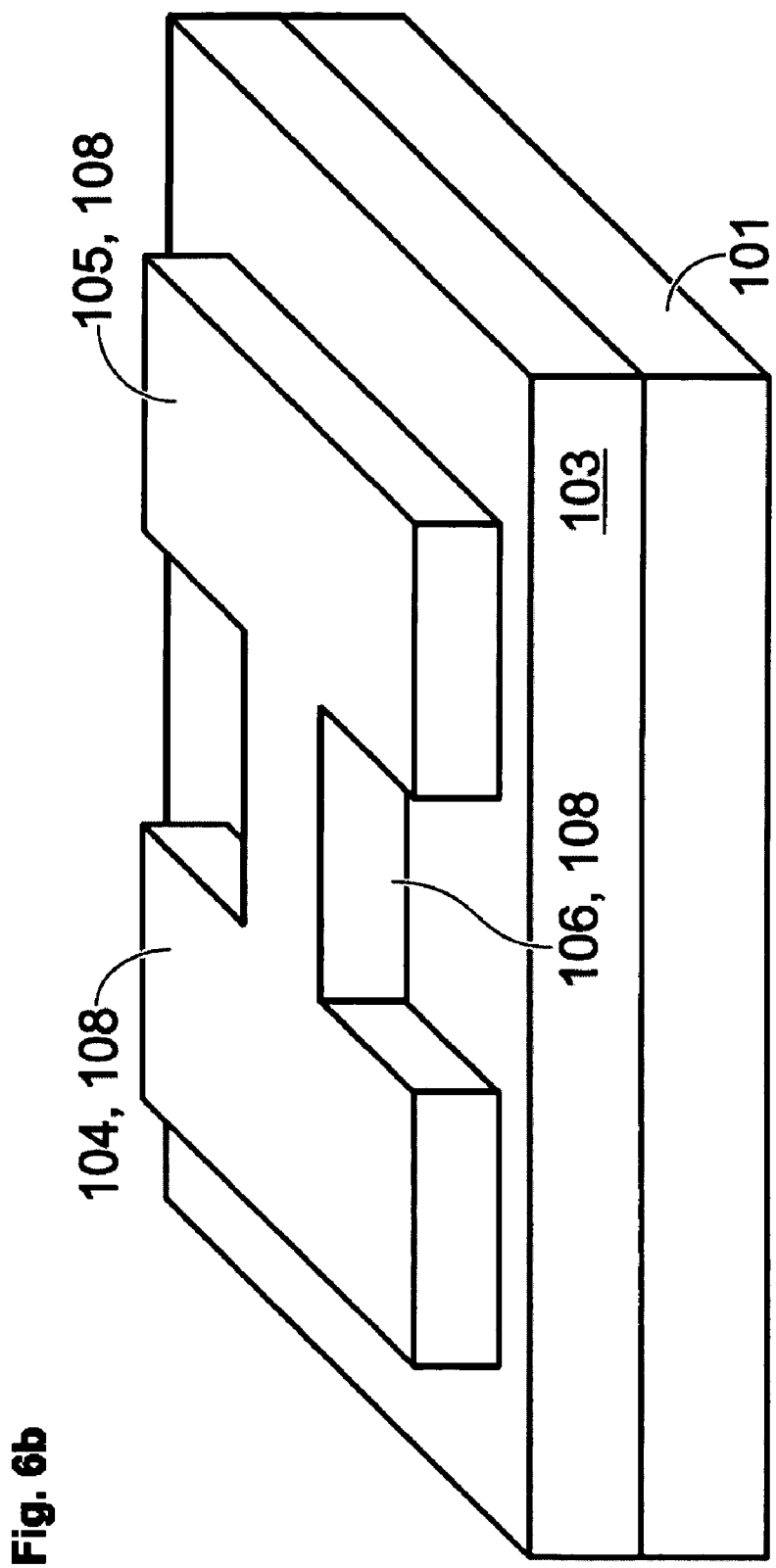
FIG. 6b illustrates the formation of a lowly doped surface layer enveloping the highly doped body of the device.

Referring to FIG. 6b, a layer 108 is formed (e.g., using epitaxial layer growth) that envelops the fin 106, the source region 104 and the drain region 105. The layer 108 is in-situ doped to a second dopant level $N_{surface}$, which is lower than the bulk concentration $N_{bulk}$. Such an approach is advantageous as the formation of the epitaxial layer reduces the roughness of the fin 106 with the layer 108. This reduced roughness may further improve the performance of the final FinFET device.

Figure 6C:
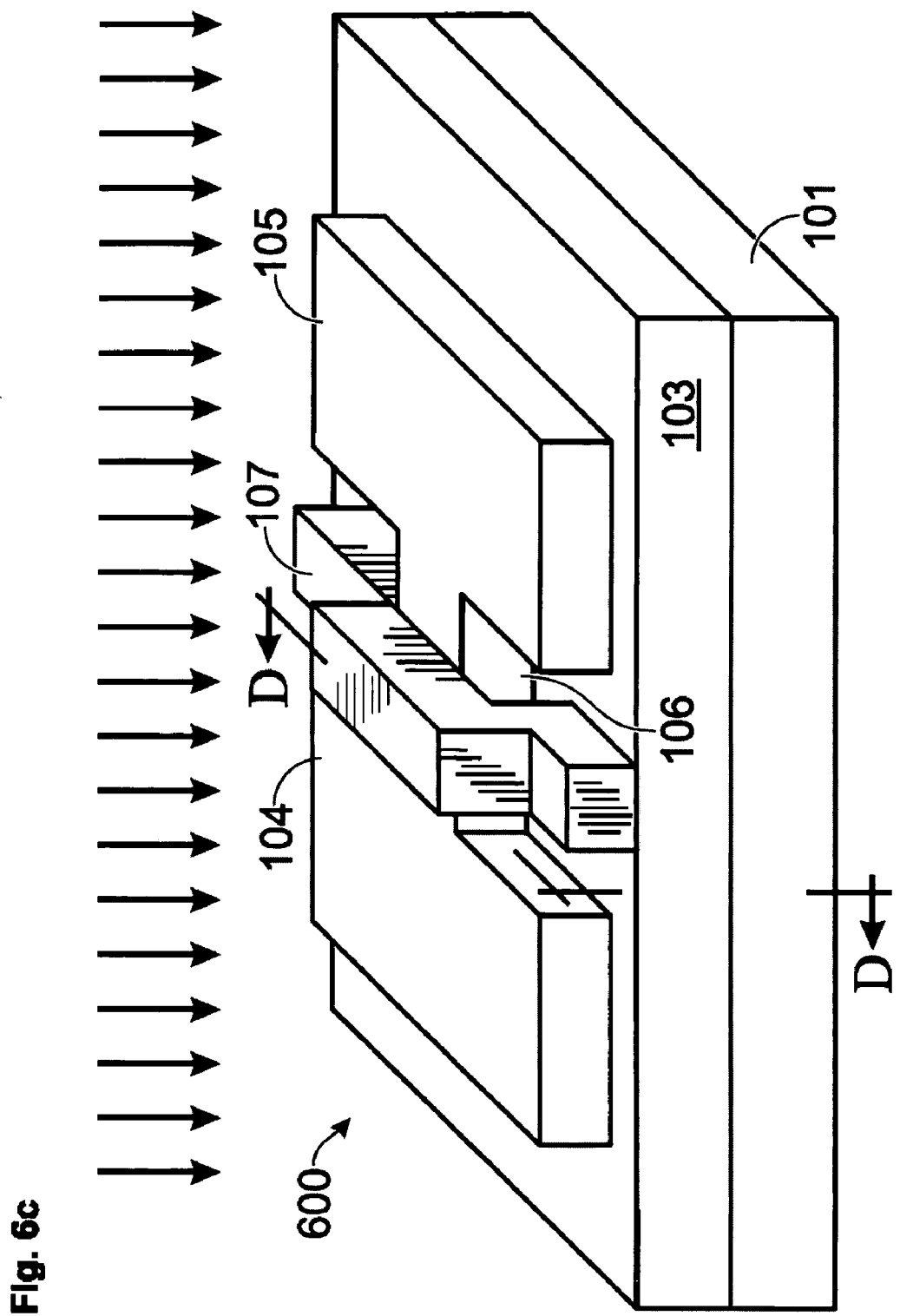
FIG. 6c illustrates the doping of the source region and the drain region while using the formed gate as a mask to block the channel(s) of the FinFET from implantation.

Referring to FIG. 6c, a drawing illustrating a gate 107 after formation and the implantation (doping) of the source region 104 and the drain region 105 is shown. As was discussed above, the doping of the portion of the epitaxial layer 108 enveloping the source region 104 and the drain region 105 will be compensated for by this counter-doping, while the portion of the layer 108 enveloping the fin 106 (which corresponds to the channel) will remain as-doped due to it being masked by the gate 107. Additional process steps are then executed to complete the processing of the FinFET device 600 (e.g., forming insulating layers covering the device, forming electrical contacts to contact the source region 104 and the drain region 105, among any number of other operations).

FIG. 6d is a cross-sectional of the FinFET device 600 shown in FIG. 6c along the line D—D. As may be seen in FIG. 6c, a body 106b of the fin 106 (which has a first dopant level) is covered at the sidewalls and along the top with a layer 106a,108. The layer 106a,108 has a second dopant level that is lower than the first dopant level, as has been previously described. This bi-layer structure is covered by the gate 107, where the overlay area between the bi-layer structure and the gate 107 defines a channel length $L_g$.

In order to produce a double gate FinFET device (such as the device illustrated in FIG. 2b), minor modifications to the above manufacturing method are made. Specifically, prior to forming or growing the layer 108 a blocking layer (e.g., the layer 109 in FIG. 2b) would be formed on the top surface of the fin 106. It will be appreciated that such a blocking layer may be formed over the unpatterned semiconductor layer 102 and then patterned in a region where the fin 106 is to be formed. The source region 104, the drain region 105 and the fin 106 are then patterned in alignment with the blocking layer.

Alternatively, the blocking layer may be deposited uniformly over the unpatterned semiconductor layer 102 and patterned along with the source region 104, the drain region 105 and the fin 106. In this scenario the patterned blocking layer 109 will substantially coincide with the pattern of the source region 104, the drain region 105 and the fin 106, as formed in the semiconductor layer 102. As discussed above selective depositing process, such as epitaxial layer growth or atomic layer deposition (ALD) may be used to form the layer 108 only on the exposed surfaces of the fin 106 (e.g., the sidewalls), and not on the patterned blocking layer on top of the fin 106.

6. Conclusion

Various arrangements and embodiments in accordance with the present invention have been described herein. It will be appreciated, however, that those skilled in the art will understand that changes and modifications may be made to these arrangements and embodiments without departing from the true scope and spirit of the present invention, which is defined by the following claims.

What is claimed is:

1. A multi-gate semiconductor device comprising:
   a source region;
   a drain region;
   a semiconductor body in between the source region and the drain region, the body connecting the source region and the drain region; and
   a gate structure formed on at least two sides of the body, wherein the semiconductor body consists of a bulk region and a surface region that are doped with the same dopant type, wherein the surface region is located between the gate structure and two sidewalls of the bulk region, wherein the bulk region has a first dopant concentration level and the surface region has a second dopant concentration level, and wherein the second dopant concentration level is less than the first dopant concentration level.

2. The device of claim 1, wherein the multi-gate semiconductor device is a FinFET device and the semiconductor body comprises a fin of the FinFET device.

3. The device of claim 2, wherein the first dopant concentration level remains constant over the bulk region.

4. The device of claim 3, wherein the second dopant concentration level remains constant over the surface region.

5. The device of claim 2, wherein the second dopant concentration level remains constant over the surface region.

6. The device of claim 2, wherein the second dopant concentration decreases from the first dopant concentration level to the second dopant concentration level within the surface region.

7. The device of claim 1, wherein the first dopant concentration level remains constant over the bulk region.

8. The device of claim 7, wherein the second dopant concentration level remains constant over the surface region.

9. The device of claim 1, wherein the second dopant concentration level decreases from the first dopant concentration level to the second dopant concentration level within the surface region.

10. A method for manufacturing a retrograde doped FinFET, comprising:
    providing a substrate;
    forming a source region on the substrate
    forming a drain region on the substrate;
    forming a fin on the substrate, wherein the fin connects the source and the drain and has a first dopant concentration; and
    forming a layer directly on exposed surfaces of the fin, the layer having a second dopant concentration lower than the first dopant concentration, wherein the fin and the layer are doped with the same dopant type.

11. The method of claim 10, wherein the second dopant concentration remains constant over the layer.

12. The method of claim 11, wherein the first dopant concentration remains constant over the fin.

13. The method of claim 10, wherein the second dopant concentration decreases from the first dopant concentration to the second dopant concentration within the layer.

14. The method of claim 10, wherein forming the layer includes in-situ doping of the layer.

15. The method of claim 10, wherein the layer is formed using epitaxial layer growth.

16. A FinFET comprising:
    a silicon-on-insulator substrate comprising a source region, a drain region, and a semiconductor fin connecting the source region and the drain region,
    wherein the semiconductor fin comprises a retrograde dopant profile from two upstanding sidewalls towards a bulk of the fin.

17. A method for manufacturing a FinFET, comprising:
    providing a silicon-on-insulator substrate
    forming on the substrate a source region, a drain region, and a fin connecting the source and the drain regions, wherein the fin is doped with a dopant having a first concentration level; and
    forming a layer directly on exposed surfaces of the fin, wherein the layer is doped with the same dopant type as the fin but at a lower concentration level.

* * * * *